United States Patent [19]

Niitsuma et al.

[11] Patent Number: 4,491,811
[45] Date of Patent: Jan. 1, 1985

[54] SURFACE ACOUSTIC WAVE DEVICE

[75] Inventors: Teruo Niitsuma; Shoichi Minagawa; Takeshi Okamoto, all of Tokyo, Japan

[73] Assignee: Clarion Co., Ltd., Tokyo, Japan

[21] Appl. No.: 506,569

[22] Filed: Jun. 22, 1983

[30] Foreign Application Priority Data

Jun. 22, 1982 [JP] Japan ................. 57-107949
Jul. 2, 1982 [JP] Japan ................. 57-115660

[51] Int. Cl.³ .................. H03H 9/145; H03H 9/30; H03H 9/64
[52] U.S. Cl. ........................ 333/151; 333/154; 333/194; 357/26

[58] Field of Search .................. 333/150–155, 333/193–196, 186; 357/26; 310/311, 313 R, 313 A, 313 B, 313 C, 313 D, 364–366

[56] References Cited

U.S. PATENT DOCUMENTS 3,955,160  5/1976  Duffy .................. 333/150
4,354,130 10/1982  Ono et al. ........... 333/154 X Primary Examiner—Marvin L. Nussbaum
Attorney, Agent, or Firm—Flynn, Thiel, Boutell & Tanis

[57] ABSTRACT

A surface acoustic wave device in which first electrodes are provided on a piezoelectric film deposited on an elastic substrate, second electrodes between the piezoelectric film and the elastic substrate, and third electrode within the piezoelectric film, respectively, so that an electric signal is applied to the first and second electrodes.

10 Claims, 10 Drawing Figures

SURFACE ACOUSTIC WAVE DEVICE

BACKGROUND OF THE INVENTION

Field of the Invention

This invention relates to a surface acoustic wave device, and more particularly to such a device in which influences by mechanical reflections of surface acoustic waves are reduced.

A surface acoustic wave device mainly consists of a piezoelectric substrate made of a piezoelectric single crystal material such as lithium niobate ($LiNbO_3$), a piezoelectric ceramic material or alternatively a combination of a non-piezoelectric plate and a piezoelectric film deposited thereon, for example, so as to convert an electric signal to a surface acoustic wave by means of a transducer provided on the piezoelectric substrate and to propagate the surface acoustic wave along the surface of the substrate. It is now employed as filters and other various electronic parts.

FIG. 1 shows a filter as an example of such electronic parts in which reference numeral 1 designates a piezoelectric substrate. Reference numeral 2 designates an input transducer consisting of a pair of interdigitating comb-shaped electrodes 2A and 2B. Reference numeral 3 denotes an input transducer consisting of a pair of interdigitating comb-shaped electrodes 3A and 3B. When an electric signal is applied to an input terminal IN, it is converted to a surface acoustic wave by means of the input transducer 2 and travels along the surface of the piezoelectric substrate 1 as shown by the arrow in the Figure. When the surface acoustic wave reaches the output transducer 3, it is reconverted to an electric signal and is taken out from an output terminal OUT. The comb-shaped electrodes 2A, 2B and 3A, 3B are so-called normalized electrodes wherein each electrode finger width W and each space L between respective adjacent interdigitating electrode fingers are $\lambda_0/4$, respectively, when $\lambda_0$ is the wavelength of the center frequency $f_0$ of a surface acoustic wave to be employed.

The transducers consisting of the comb-shaped electrodes with said finger width and space, however, cause mechanical reflections such as multiple reflections i.e. so-called T.T.E.(triple transit echoes) of a surface acoustic wave, thereby worsening the wave passing-through effect of the filter, for example.

To prevent such a mechanical reflection, it is known to, as shown in FIG. 2, divide each finger of the comb-shaped electrodes 2A, 2B, 3A and 3B into two parts so that each divided electrode finger width W and each space L between the respective adjacent interdigitating electrode fingers become $\lambda_0/8$, respectively. It is called a double electrode transducer. In the double electrode transducer, since phases of reflected waves at the tips of the respective electrode fingers are different by 180° so as to be opposite phases, the reflected waves counteract each other.

However, the double electrode tranducer requires a high working accuracy because higher the frequency, smaller the wavelength $\lambda_0$ becomes. Further, the double electrode transducer is liable to cause short circuit between opposed electrodes or breakdown of electrodes, thereby leading to a lower productivity of the device.

To overcome the drawbacks, single-phase transducers as shown in FIGS. 3(a) and 3(b) have been proposed. This structure employs the piezoelectric substrate 1 comprising an elastic plate 4 and a piezoelectric film 5 deposited thereon. A lower electrode 6 to serve as one counterpart of the comb-shaped electrodes is made on the elastic plate 4 and under the piezoelectric film 5 while upper electrodes 7A and 7B each to serve as the other counterpart of the comb-shaped electrodes are made on the piezoelectric film 5 so as to be opposed to the lower electrode 6. Each electrode finger width W and each space L between the electrode fingers are $\lambda/2$, respectively.

With this arrangement, by connecting a signal source 8 to the upper electrode 7A and the lower electrode 6, generating and propagating a surface acoustic wave and taking out the resulting electric signal from an end of the load 9 connected between the upper electrode 7B and the lower electrode 6, it is possible to prevent short circuit between the opposed counterparts of the electrodes and to relax their working accuracy, thereby leading to a better productivity of the device.

However, this construction does not allow a driving of the transducers employing balance power supply from the power source 8. Therefore, influences by electric signals which are not converted to surface acoustic waves and travel as they are direct waves (so-called feedthrough) cannot be cancelled, thereby worsening the wave passing-through effect of the device.

To overcome the drawback, further, it has been proposed to oppose two pieces of single phase transducers in parallel with each other. More specifically, further upper comb-shaped electrodes 8A and 8B are added and are opposed to the aforementioned upper electrodes 7A and 7B at $\lambda_0/2$ phase difference and at a space a. This construction permits a driving of the transducers by balance power supply by applying an electric signal at 180° phase difference to the upper electrodes 7A and 7B from the power source 8 via a balance power supply transformer T, thereby reducing influences by the feedthrough.

The construction, however, cannot give a complete solution because the space a to prevent short circuit between the opposed electrodes causes turbulence of the waveform of the composite wave of surface acoustic waves $S_1$ and $S_2$ excited by the electrodes 7A and 8A, respectively.

OBJECT OF THE INVENTION

It is therefore an object of the invention to provide a surface acoustic wave device electrodes of which can be easily worked and the productivity of which is improved.

A further object of the invention is to provide a surface acoustic wave device which does not cause mechanical reflections of surface acoustic waves.

A still further object of the invention is to provide a uni-directional transducer which has a good nature in its surface acoustic wave propagating direction and does not cause electric reflections of surface acoustic waves.

SUMMARY OF THE INVENTION

In accordance with the present invention, there is provided a surface acoustic wave device which comprises: a piezoelectric substrate made of an elastic plate and a piezoelectric film deposited thereon; first electrode provided on the piezoelectric film; second electrode provided on the elastic plate at a predetermined positional lag from the first electrode in a direction to propagate a surface acoustic wave; and third electrode provided within the piezoelectric film.

DETAILED DESCRIPTION OF THE PREFERRED EMBODIMENTS

Figure 1:
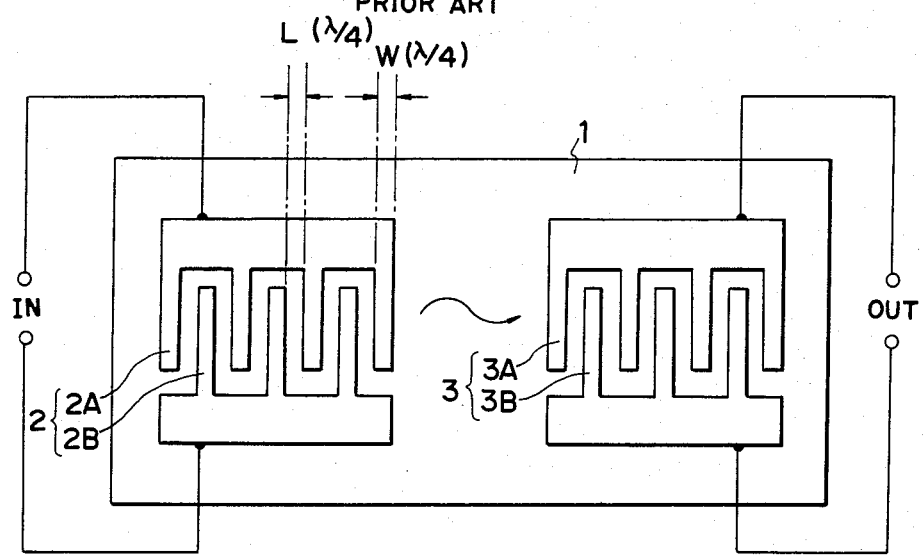
FIGS. 1, 2, 3(a) and 4 are plan views showing conventional surface acoustic wave devices.
Figure 2:
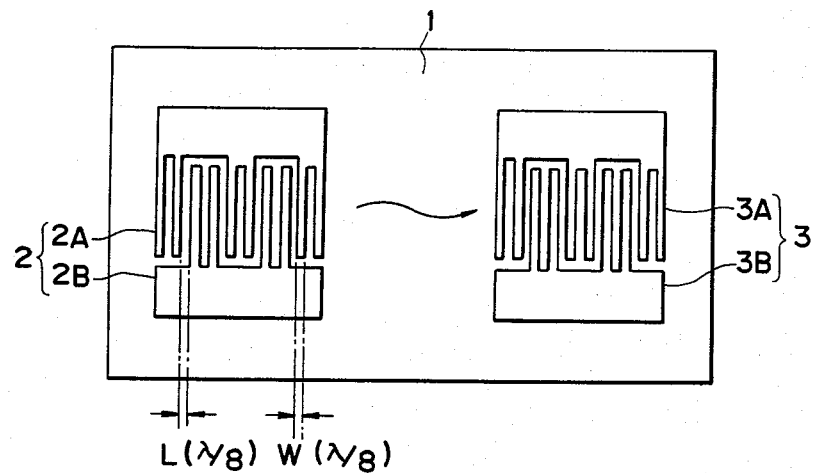
Figure 3A:
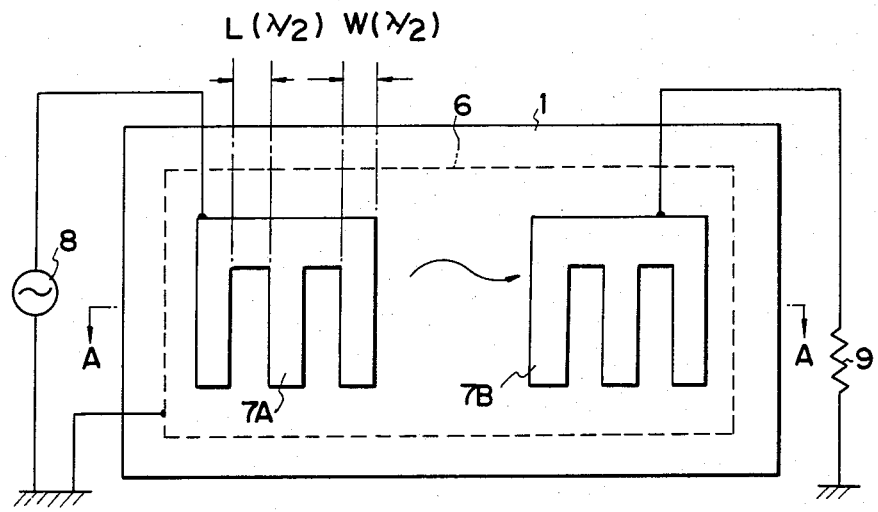
Figure 3B:
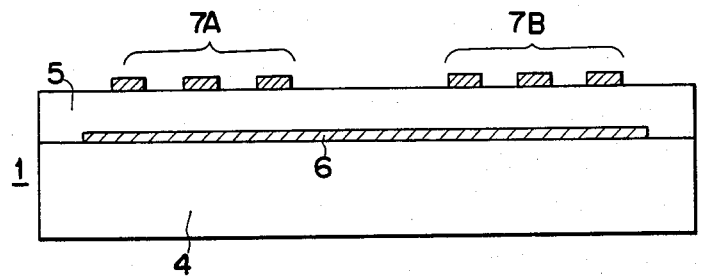
FIG. 3(b) is a sectional view of the device of FIG. 3(a)
Figure 4:
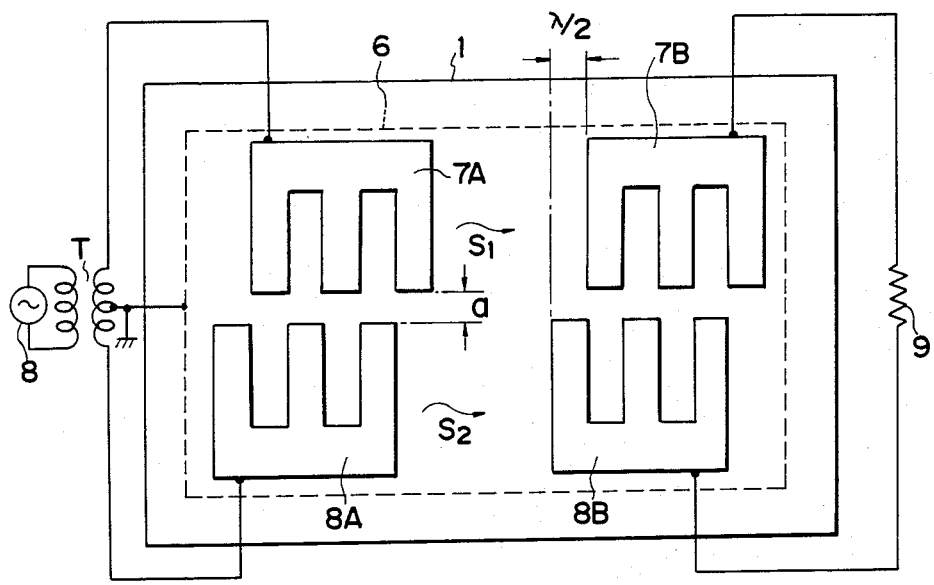

The invention will now be described in detail by way of preferred embodiments, referring to the drawings.

Figure 5A:
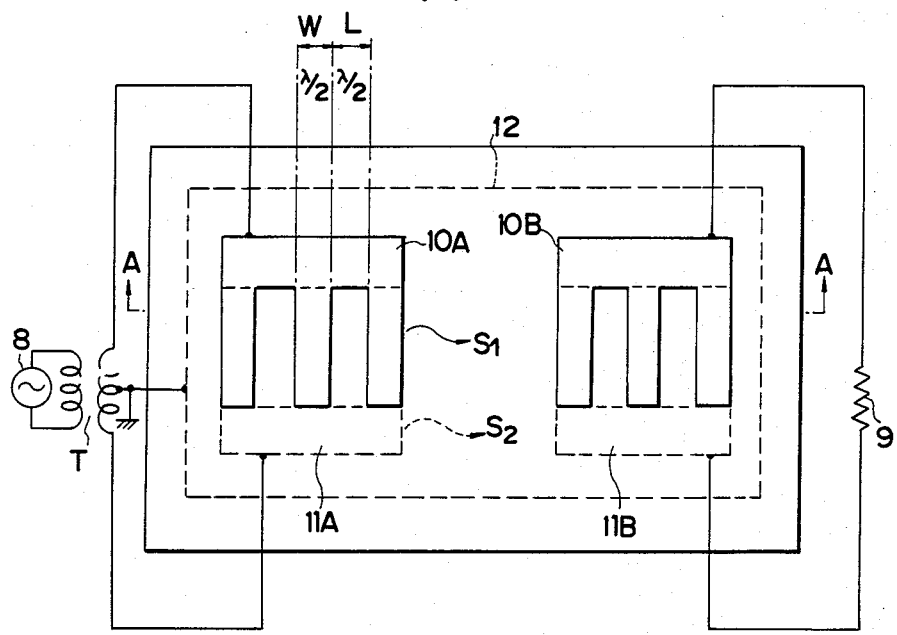
FIGS. 5(a) and 5(b) are a plan view and a sectional view both showing an embodiment according to the present invention.
Figure 5B:
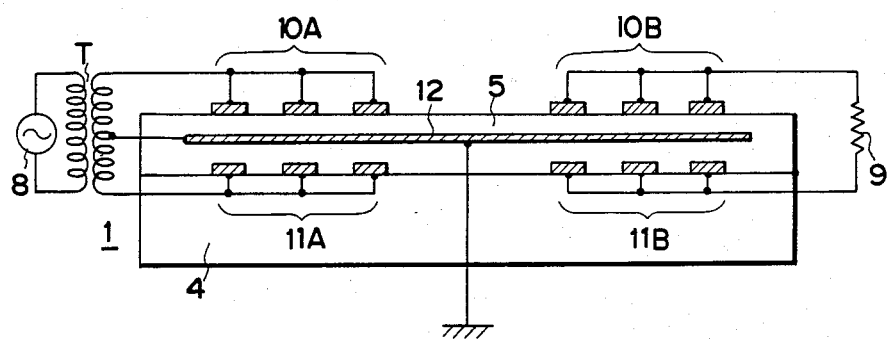

FIGS. 5(a) and 5(b) are a plan view and a sectional view of an embodiment of the surface acoustic wave device according to the invention. On a piezoelectric substrate 1 comprising an elastic plate 4 and a piezoelectric film 5 deposited thereon, first input and output comb-shaped electrodes 10A and 10B are provided. Second input and output comb-shaped electrodes 11A and 11B are provided on the elastic plate 4. Each electrode finger width W and each space L between the electrode fingers of all the comb-shaped electrodes 10A, 10B, 11A and 11B are $\lambda_0/2$, respectively.

Third electrode 12 which forms a flat sheet is provided inside the piezoelectric film 5 so as to extend between the first electrodes 10A, 11A and the second electrodes 11A, 11B, and at a same distance from the first electrodes and the second electrodes. A load resistance 9, for example, is connected between the first output electrode 10B and the second output electrode 11B.

With this arrangement, when a signal source 8 is connected between the first and second input electrode 10A and 11A, and the third electrode 12 is connected to the earth potential, the first and the second input electrodes are applied, respectively, with signal voltages which have a substantially same amplitude but are different in their phases by 180°. So, two electric fields with a same direction and a same strength are generated: one between the first input electrode 10A and the third electrode 12 and the other between the first input electrode 11A and the third electrode 12. Thereby, surface acoustic waves $S_1$ and $S_2$ with a same phase are generated in a region involving the first electrode 10A and in a region involving the second electrode 11A, respectively. The surface acoustic waves $S_1$ and $S_2$ travel as enforcing each other.

Since the electrode finger width W and the space L of the first and second electrodes are $\lambda_0/2$, respectively, the transducer does not require too severe working accuracy and is manufactured easily as compared to the conventional devices wherein the width W and the space L of the electrode fingers are $\lambda_0/4$ or $\lambda_0/8$.

Broader measurement of the width W and the space L of the electrode fingers also leads to reduction of short circuit or break-down of the electrodes of the transducer and to a better productivity of the device. Particularly, since the first and second electrodes 10A and 11A to which electric signals are applied are spaced at the opposite faces of the piezoelectric film 5, short circuit seldom occurs.

The device with $\lambda_0/2$ wide electrode fingers does not cause mechanical reflections of a surface acoustic wave and effectively suppresses the T.T.E. Further, since the electrode finger is wider and the space between the electrodes is smaller than those of the conventional devices, capacitance between the electrodes is increased.

As the result, input impedance of the transducer is reduced, and matching to outer circuits becomes easier.

The embodiment of FIGS. 5(a) and 5(b) is arranged so that the first electrodes 10A and 11A are aligned with the second electrodes 10B and 11B, respectively, when they are seen in the plan view 5(a), so as to enable the balance power supply to cancel the feedthrough. However, in case that the feedthrough need not be considered, the first electrodes 10A and 11A may be disposed at $(\theta-\pi)\lambda_0/2\pi$ lag in the SAW travelling direction from the second electrodes 10B and 11B, respectively, or vice versa, when $\theta(0<\theta<2\pi)$ is the phase difference between the signals applied to the first and second electrodes.

Figure 6:
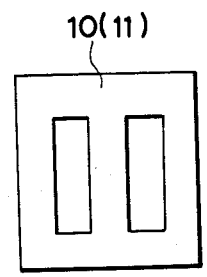
FIG. 6 is a schematic view showing another type of the electrode.

FIG. 6 shows another type of the first and second electrodes 10 or 11, namely a slit-type electrode.

The elastic plate 4 may be made of a semiconductive material. This permits incorporation of the surface acoustic wave device and other electronic devices into an integrated circuit. Thus, the device will be employed in a broader technical field.

The piezoelectric film 5 is preferably made of zinc oxide (ZnO) or alminum nitride (A/N) to further improve the nature of the device.

Figure 7A:
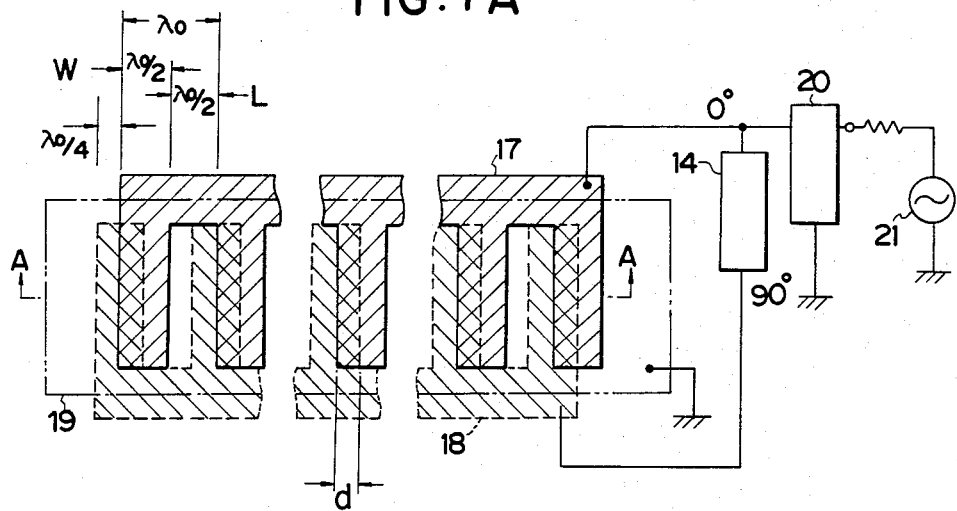
FIGS. 7(a) and 7(b) are a schematic plan view and a sectional view both showing a still further embodiment according to the present invention.
Figure 7B:
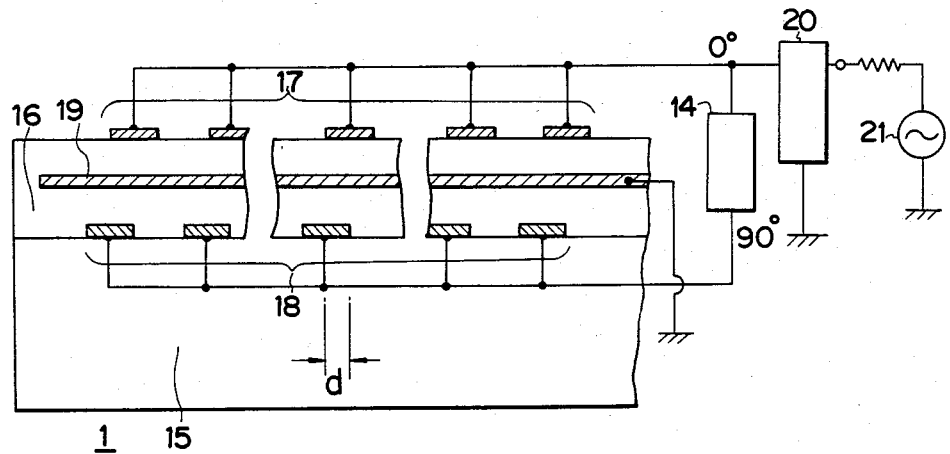

FIGS. 7(a) and 7(b) are a plan view and a sectional view of a further embodiment of the surface acoustic wave device. The piezoelectric substrate 1 consists of an elastic plate 15 and a piezoelectric film 16 deposited thereon. A comb-shaped first electrode 17 provided on the piezoelectric film 16 and a comb-shaped second electrode 18 provided on the elastic plate 15 form a so-called single phase transducer with $\lambda_0/2$ wide electrqde finger width W and space L between the electrode fingers. A sheet-like third electrode 19 is provided inside the piezoelectric film 16 at a substantially same distance from the first electrode 17 and the second electrode 18.

The first and second electrodes 17 and 18 are disposed so that the positional lag d therebetween in the SAW travelling direction is $\lambda_0/4$.

With this arrangement, a signal source 21 is connected via a matching circuit 20 to the first and second electrodes 17 and 18 and further via a 90° phase shifter to the second electrode 18, and the third electrode 19 is connected to the earth potential. Thereby, a signal with 90° phase difference is applied between the first and second electrodes 17 and 18, thereby producing electric fields with 90° phase difference between the first electrode 17 and the third electrode 19 and between the second electrode 18 and the third electrode 19, respectively, and propagating surface acoustic waves with 90° phase difference from the region involving the first electrode 18 and from the region involving the second electrode 19, respectively.

In order to ensure the unidirectional function of the transducer, it is necessary that the surface acoustic waves generated from the plural exciting sources enforce each other in one of regions (A and A') at both sides of the transducer while they counteract each other in the other region. This is subjected to the sum of a positional phase difference between the exciting sources plus a phase difference between the signals applied to the exciting sources.

In the embodiment of FIGS. 7(a) and 7(b), the sum of the positional and signal phase differences amounts to 360° (0°) at the region A and amounts to 180° at the region A', whereby the surface acoustic waves travel in only one direction toward A.

The device according to the embodiment can be easily manufactured as compared to a conventional three phase excitation transducer wherein one of three electrodes must be formed in a different level at a crossing portion thereof with the other electrodes.

The first and second electrodes 17 and 18 are disposed at 90° positional lag irrespective of the number N of the electrode finger pairs. Therefore, the device does not have such a drawback involved in a conventional unidirectional transducer employing a 90° phase shifter wherein, if the number N is large, the nature of propagating a surface acoustic wave in only one direction is extremely lost when a signal slightly slips out of the center frequency $f_0$, thereby enlarging use of the device in a wider band frequency.

Since electric reflections of surface acoustic waves are completely prevented due to the unidirectional wave propagation, the device is remarkably effective in suppressing the multiple reflection (triple transit echo).

The first and second electrodes 17 and 18 may be formed in other shapes i.e. in a slit type electrode as shown in FIG. 6, instead of the comb-shaped electrode.

We claim:

1. A surface acoustic wave device which comprises:
    an elastic substrate;
    a piezoelectric film deposited on said elastic substrate;
    input and output first electrodes both provided on said piezoelectric film;
    input and output second electrodes both provided between said piezoelectric film and said elastic substrate;
    third electrode provided within said piezoelectric film and between said first electrodes and said second electrodes; and
    a signal supply means applying an electric signal to the first and second input electrodes.

2. A surface acoustic wave device as set forth in claim 1 wherein said first and second electrodes are disposed at a predetermined positional lag in a direction to propagate a surface acoustic wave generated in said device.

3. A surface acoustic wave device as set forth in claim 2 wherein said lag is $(\theta - \pi)\lambda_0/2\pi$ ($\lambda_0$ is wavelength of the surface acoustic wave, and $\theta$ is a phase difference of the electric signal).

4. A surface acoustic wave device as set forth in claim 2 wherein said electric signal has 90° phase difference.

5. A surface acoustic wave device as set forth in claim 1 wherein said electric signal has 180° phase difference.

6. A surface acoustic wave device as set forth in claim 1 wherein said third electrode is connected to an earth potential point.

7. A surface acoustic wave device as set forth in claim 1 wherein said first and second electrodes each have plural electrode fingers which are wide and spaced as much as one half of the wavelength of the surface acoustic wave.

8. A surface acoustic wave device as set forth in claim 7 wherein said first and second electrodes have a same configuration.

9. A surface acoustic wave device as set forth in claim 3 wherein said lag in one forth of the wavelength of said surface acoustic wave.

10. A surface acoustic wave device as set forth in claim 1 wherein said elastic substrate is made of a semiconductive material.

* * * * *